US010028355B1

(12) United States Patent
Hancock et al.

(10) Patent No.: US 10,028,355 B1
(45) Date of Patent: Jul. 17, 2018

(54) SMART MODULE FOR LIGHTING FIXTURE

(71) Applicant: FLORIDA POWER & LIGHT COMPANY, Juno Beach, FL (US)

(72) Inventors: Joel C. Hancock, Jupiter, FL (US); William John Kerrigan, Navan (IE)

(73) Assignee: SELC IRELAND LIMITED (IE)

( * ) Notice: Subject to any disclaimer, the term of this patent is extended or adjusted under 35 U.S.C. 154(b) by 0 days.

(21) Appl. No.: 15/445,626

(22) Filed: Feb. 28, 2017

(51) Int. Cl.
*G06F 13/42* (2006.01)
*F21V 14/02* (2006.01)
*G01J 1/42* (2006.01)
*H05B 37/02* (2006.01)
*G01R 21/133* (2006.01)
*H04L 29/08* (2006.01)
*F21V 3/02* (2006.01)
*F21V 23/00* (2015.01)
*F21S 8/08* (2006.01)

(52) U.S. Cl.
CPC ..... *H05B 37/0218* (2013.01); *G01R 21/1333* (2013.01); *H04L 67/12* (2013.01); *H05B 37/0272* (2013.01); *F21S 8/088* (2013.01); *F21V 3/02* (2013.01); *F21V 23/001* (2013.01)

(58) Field of Classification Search
CPC ............ H05B 37/0218; H05B 37/0272; G01R 21/1333; H04L 67/12
See application file for complete search history.

(56) References Cited

U.S. PATENT DOCUMENTS

| 5,626,417 | A  | * | 5/1997  | McCavit ............... F21S 8/033 250/353 |
| 6,091,200 | A  | * | 7/2000  | Lenz ................... F21V 23/0442 315/158 |
| 8,867,233 | B2 |   | 10/2014 | Manion et al. |
| 9,101,027 | B2 |   | 8/2015  | Donegan et al. |
| 9,121,580 | B1 | * | 9/2015  | Bryant .................... F21V 19/00 |
| 2007/0057807 | A1 | * | 3/2007 | Walters .................. G06Q 30/04 340/7.29 |
| 2009/0267519 | A1 | * | 10/2009 | Pearse .................... F21V 19/00 315/117 |
| 2012/0137126 | A1 |   | 5/2012 | Matsuoka et al. |

(Continued)

OTHER PUBLICATIONS

SELC Internal CMS Module: found on the internet at: http://www.selc.ie/assets/files/downloads/8127-SELC-(Internal-CMS)_V3_LR.pdf, Feb. 28, 2017, pp. 1-2.

(Continued)

*Primary Examiner* — Tung X Le
*Assistant Examiner* — Raymond R Chai
(74) *Attorney, Agent, or Firm* — Tarolli, Sundheim, Covell & Tummino LLP

(57) ABSTRACT

A smart module can include a housing sized for insertion through an opening of a lighting fixture that is exposed by removal of a door of the light fixture. The smart module can also include a smart meter in the housing. The smart meter can be electrically coupled to an input wire and an output wire. The smart module can further include a light sensor external to the housing that is electrically coupled to the smart meter that changes from a closed state to and open state based on detected light. The light sensor can include a threaded portion extending from a base that receives a locking nut. The locking nut and the base portion are sized for affixing the light sensor in an aperture of the door.

20 Claims, 8 Drawing Sheets

(56) References Cited

U.S. PATENT DOCUMENTS

| | | | |
|---|---|---|---|
| 2014/0056010 A1* | 2/2014 | Devlin | F21S 8/038 362/418 |
| 2014/0061480 A1* | 3/2014 | Huang | G01J 1/42 250/353 |
| 2014/0292208 A1* | 10/2014 | Chemel | H05B 33/0854 315/154 |

OTHER PUBLICATIONS

PELCO Catalog 2010: found on the Internet at: http://www.raiproducts.com/images/Mounting_Hardware/PELCO_CATALOG_2010.pdf, Feb. 28, 2017, pp. 156-158.

* cited by examiner

SMART MODULE FOR LIGHTING FIXTURE

TECHNICAL FIELD

This disclosure relates to a smart module for installation in a lighting fixture.

BACKGROUND

A lighting fixture, which may also be referred to as a light fitting or luminaire is an electrical device used to create artificial light by use of an electric lamp. Lighting fixtures have a fixture body and a light socket to hold the lamp and allow for its replacement. A lighting fixture may also have a switch, such as an automatic or manual switch to control the light. A lighting fixture includes an electrical connection to a power source and permanent or semi-permanent lighting may be directly wired to the power source and moveable lighting fixtures (e.g., lamps) have a plug for an outlet. Lighting fixtures may also have other features, such as reflectors for directing the light, an outer shell or housing for lamp alignment and protection and an electrical ballast or power supply.

A lamp post, which may be referred to as a street light, light pole, street lamp, light standard, or lamp standard is a raised lighting fixture that may be installed on the edge of a road or walkway. Modern lamp posts may also have light-sensitive photocells that activate automatically when light is needed.

A smart meter is an electronic device that records consumption of electric energy in intervals of an hour or less and communicates that information back to a utility provider for monitoring and billing at predetermined intervals. Smart meters enable two-way communication between the meter and a central system at the utility provider. Unlike home energy monitors, smart meters can gather data for remote reporting. Such an advanced metering infrastructure (AMI) differs from traditional automatic meter reading (AMR) in that it enables two-way communications with the meter.

SUMMARY

One example relates to a smart module that can include a housing sized for insertion through an opening of a lighting fixture that is exposed by removal of a door of the light fixture. The smart module can also include a smart meter in the housing. The smart meter can be electrically coupled to an input wire and an output wire. The smart module can further include a light sensor external to the housing that is electrically coupled to the smart meter that changes from a closed state to and open state based on detected light. The light sensor can include a threaded portion extending from a base that receives a locking nut. The locking nut and the base portion are sized for affixing the light sensor in an aperture of the door.

Another example relates to a method that can include detaching a door on a base of a lighting fixture, wherein the door includes an aperture. The method can also include removing a photocell receptacle affixed to the door. The method can further include inserting a housing of a smart module through an opening to an internal cavity of the base of the lighting fixture. The method can yet further include affixing a light sensor of the smart module to the door. A light detecting portion of the light sensor can be exposed to light via the aperture in the door. The method can still yet further include reattaching the door to the base of the fixture.

Yet another example relates to a method that can include detaching a door from a base of a lighting fixture that lacks an electrical connection to a top portion of a globe of the light fixture, wherein the door includes an aperture. The method can also include removing a photocell receptacle affixed to the door. Removing the photocell receptacle can include cutting a plurality of wires coupled to the photocell receptacle. The method can also include removing a window that overlays the aperture and inserting a housing of a smart module through an opening to an internal cavity of the base of the lighting fixture. The smart module can include a housing that houses a smart meter and a network interface card. The method can still yet further include connecting each of a plurality of power wires of the smart module with a corresponding wire cut to remove the photocell receptacle. The method can still further include affixing a light sensor of the smart module to the door, wherein a light detecting portion of the light sensor protrudes through the aperture in the door for exposure to an exterior side of the door and reattaching the door to the base of the fixture.

DETAILED DESCRIPTION

Figure 1A:
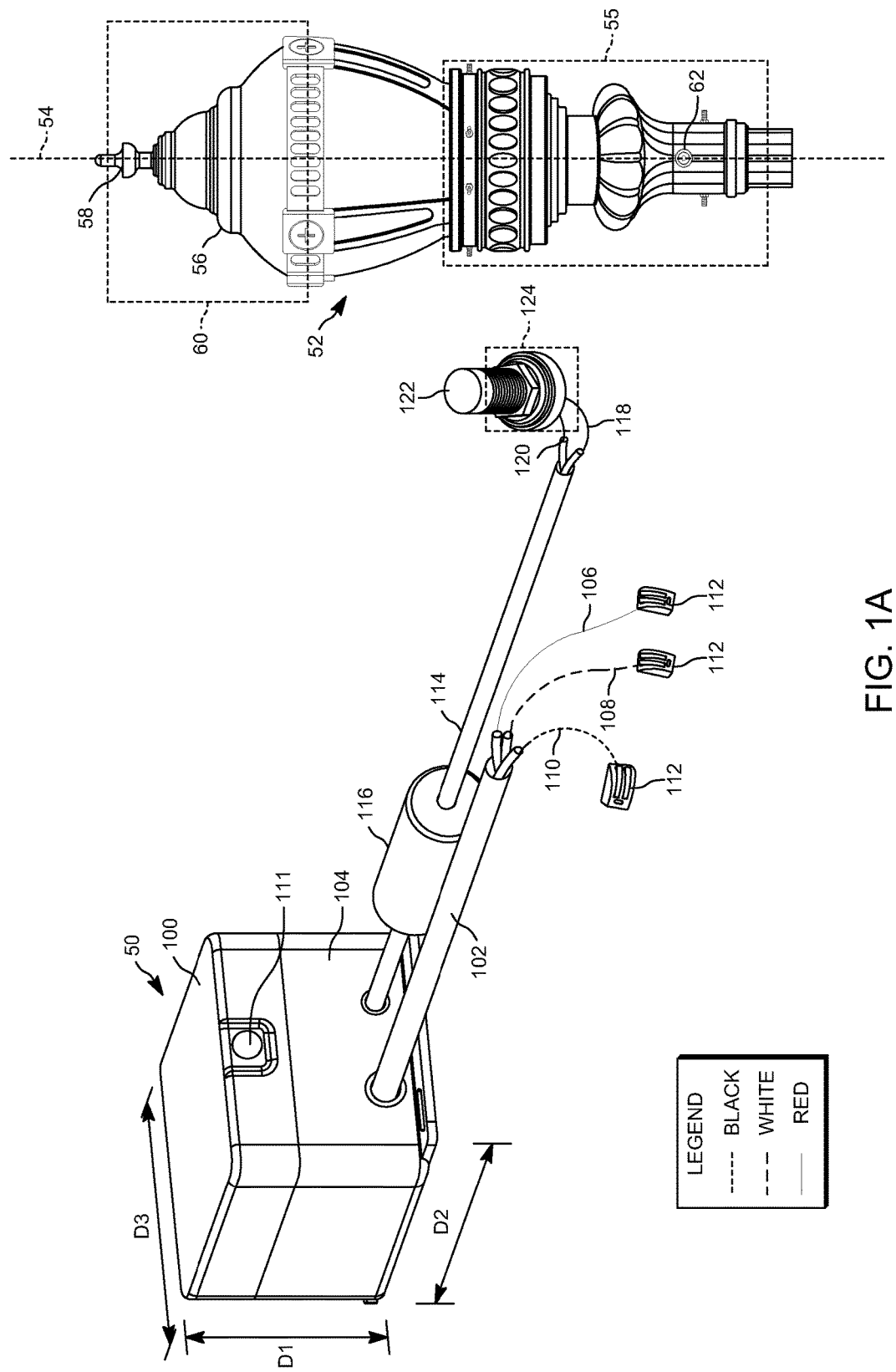
FIG. 1A illustrates an example of a smart module configured for installation in a lighting fixture.

This disclosure is directed to a smart module that can be retrofitted into an existing lighting fixture (a lamp post) that has a finial mounted on a globe. The lighting fixture may be a post-top fixture that can be mounted on steel poles at various heights. The lighting fixture houses a light socket, a photocell, a photocell tray and other components (e.g., a ballast). The photocell tray includes a twist-lock photocell receptacle that is positioned within the lighting fixture relative to a window (a photocell window). The window is situated at a given location on a surface of the lighting fixture that is normal to a center of the lighting fixture. The window can be situated on a door of a base portion of the lighting fixture. In such examples, the photocell can be installed/replaced by opening the door and inserting (maneuvering) the photocell through an opening (previously covered by the door) and mate the photocell with the twist-lock receptacle via a twisting motion thereby locking-in the photocell onto the photocell tray, such that the photocell is in close proximity with the window.

To retrofit the lighting fixture with intelligence, the photocell receptacle and photocell tray are removed from lighting fixture and replaced with a smart module that includes a smart meter, such as a module from Smart Efficient Light Control (SELC) (e.g., model number 8S71606 001001 1) and a light sensor. The smart module is a self-contained module with a housing that has a form factor and dimensions that enable placement of the smart module within an internal cavity of the lighting fixture. Thus, the lighting fixture can house the internal smart module.

The smart module includes wires extending from the housing that can be coupled to the light sensor to enable the smart module to receive signals generated by the light sensor. The light sensor can be positioned relative to the photocell door such that a portion of the light sensor extends tangential to the lighting fixture and through an aperture in the door. Arranging the light sensor in this configuration enables the retrofitted lighting fixture to be controlled based on ambient light, similar to an existing (non-retrofitted) lighting fixture. Further, this configuration provides sufficient volume in the internal cavity of the lighting fixture so that the smart module can be housed therein.

The internal smart module includes a network interface card (NIC). The NIC allows the smart meter (e.g., a controller) of the internal smart module and a remote node (e.g., another retrofitted lighting fixture, a gateway, a computer or hand-held device) to communicate to each other over a network in accordance with a defined communication protocol (e.g., Institute of Electrical and Electronics Engineers (IEEE) 802.15.4g, Internet Protocol Version 6 (IPv6)). In one example, the network is a mesh network. The smart meter can be configured to monitor parameters of the retrofitted lighting fixture (e.g., status, voltage/current draw, power draw, light output, ambient light, etc.). Data characterizing the monitored parameters can be transmitted to and from the remote node via the NIC. The smart meter can further be configured to control an operation of the retrofitted lighting fixture based on control parameters (e.g., light intensity, on/off times, etc.). The control parameters can be updated in response to control updates from the remote node. Alternatively, the controller parameters can be updated based on the monitored parameters (e.g., signals generated by the light sensor in response to ambient light). By installing the smart module into the lighting fixture in the manner described herein, additional functionality for the lighting fixture can be achieved without necessitating manufacturing changes to the lighting fixture.

FIG. 1A illustrates a smart module 50 designed for installation in an exterior lighting fixture 52. The lighting fixture 52 could be implemented on a lamp post. Moreover, the smart module 50 can be installed in the lighting fixture 52 after the lighting fixture 52 is installed at a permanent location (e.g., a retrofit). Alternatively, the smart module 50 could be installed in the lighting fixture 52 prior to permanent installation of the lighting fixture 52 (e.g., in a service depot).

The lighting fixture 52 includes a base portion 55 (e.g., a base/housing) that houses electrical components for controlling an illumination state of the lighting fixture 52. In particular, the base portion 55 includes a light receptacle for an illumination source, such as an incandescent light bulb, a fluorescent lamp or a light emitting diode (LED). The base portion 55 also includes a ballast for providing power to the light receptacle. The lighting fixture 52 is designed (upon installation) to extend vertically along an axis 54. The base portion 55 includes a receptacle for a globe 56 that is formed of glass, or some other transparent or translucent material, such as polycarbonate. In some examples, the globe 56 can include a receptacle for a finial 58. In other examples, the final 58 may be excluded, and the globe 56 may have a top that forms an apex or a dome. However, in either example, the lighting fixture 52 lacks an electrical connection to a top portion 60 of the globe 56. Accordingly the base portion 55 of the lighting fixture 52 includes an aperture 62 (a hole) facing a direction that is substantially perpendicular to the axis 54 (e.g., a direction out of the surface of FIG. 1). The globe 56 may have a decorative shape, such as an acorn shape, a dome shape, etc.

Figure 1B:
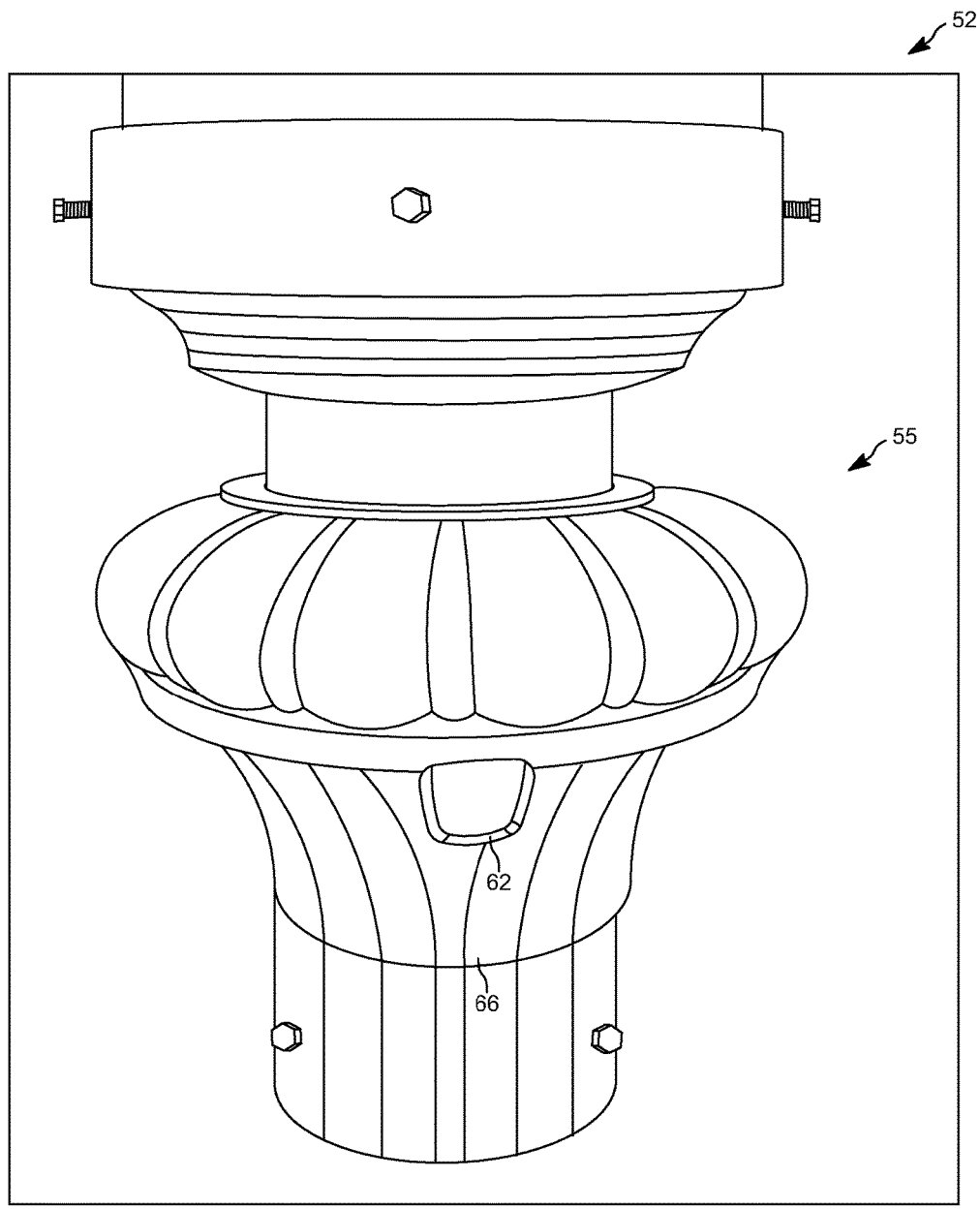
FIG. 1B illustrates an expanded view of a base portion of the lighting fixture.

The aperture 62 exposes an internal cavity of the base portion 55 of the lighting fixture 52 to ambient (exterior) light. The aperture 62 may be covered with a window formed of glass or other transparent or translucent material. The lighting fixture 52 may be installed (or shipped from a manufacturer) with a photocell installed therein. FIG. 1B illustrates an expanded view of the base portion 55 of the lighting fixture 52.

Figure 1C:
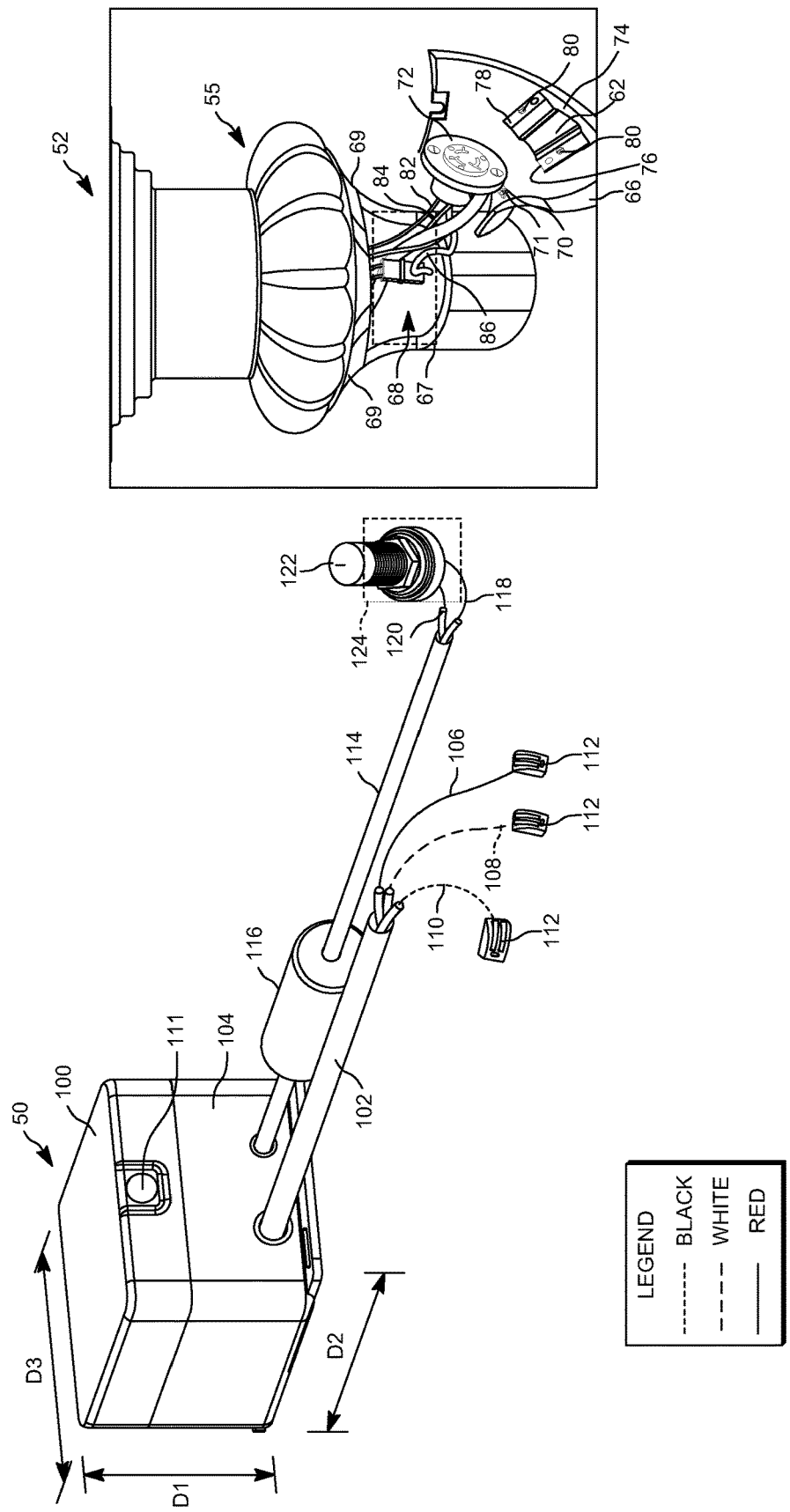
FIG. 1C illustrates an expanded view of the smart module and the base portion of the lighting fixture with a door removed.

As illustrated in FIG. 1B, the aperture 62 exposes an internal cavity of the lighting fixture 52. Additionally, the base portion 55 includes a removable/detachable door 66 that allows a technician to access the internal cavity of the base portion 55. FIG. 1C illustrates the smart module 50 and the base portion 55 upon opening (detaching) the door 66 from the base portion 55.

As illustrated in FIG. 1C, removal of the door 66 allows access to an opening 67 that exposes the internal cavity 68 of the base portion 55. The door 66 can be attached to the base portion 55 by fasteners 69 attached to opposing sides of the base portion 55. The fasteners 69 could be implemented, for example, as screws or bolts. The door 66 includes a photocell tray 70 for a photocell receptacle 72. The photocell receptacle 72 can be a twist-lock receptacle that receives a standard photocell (not shown).

Moreover, as illustrated in FIG. 1C, the door 66 also includes a window 74 that overlays the aperture 62. The window 74 can be formed of a pane of glass or other transparent or translucent material. Moreover, the window 74 can be held in a static position by a first hold-down bracket 76 and a second hold-down bracket 78 positioned near opposing edges of the window 74. Each of the first hold-down bracket 76 and the second hold-down bracket 78 can be attached to the door 66 with a fastener 80, such as a screw or bolt. The window 74 and the aperture 62 can be positioned such that, upon installation of a photocell into the photocell receptacle 72, and closing the door 66, the photocell is in close proximity with the window 74 to allow the photocell to detect light via the aperture 62.

In some examples, the photocell receptacle 72 is a three terminal alternating current (AC) device. In particular, the photocell receptacle 72 is coupled to a black input wire 82 that may be coupled to an input signal in the range of 105 to 305 Volts (V) AC, a white neutral wire 84 and a red output wire 86. For purposes of simplification of explanation, throughout this disclosure, wires are described as having a particular color. The color characterizes a color of a shielding/insulation that surrounds a corresponding wire. It is noted that the particular color described (e.g., black, white or red) is intended only to describe one possible example, and in other examples, alternate colors could be employed.

The red output wire 86 is also coupled to the ballast (or driver) of the base portion 55. A photocell (not show) inserted into the photocell receptacle 72 can be configured such that when light falls below a threshold level (indicating that the environment is dark), the photocell activates an AC signal at the red output wire 86, such that a light inserted in the light receptacle of the base portion 55 is illuminated.

The smart module 50 can be retrofitted into and housed by the base portion 55 of the lighting fixture 52. The smart module 50 can include a housing 100. As one example, the housing 100 of the smart module 50 can be shaped as a rectangular prism with rounded corners and edges.

A power wire harness 102 extends perpendicularly from a face 104 (a surface) of the housing 100. The power wire harness 102 can be formed of a flexible, electrically insulating tube, such as rubber (e.g., synthetic rubber). The power wire harness 102 can house three wires that are color coded. Ends of the three wires connect to components internal to the housing 100 and extend beyond the power wire harness 102. In particular, a black input wire 106 (or other color) extending from the power wire harness 102 can be coupled to electrical components inside the housing 100. The black input wire 106 extending from the power wire harness 102 can be configured to receive a 105 to 305 V AC input signal. A white (or other color) neutral wire 108 can also extend from the power wire harness 102. The white neutral wire 108 can be an electrically neutral wire. The power wire harness 102 can further include a red output wire 110. The red output wire 110 can intermittently output an AC power signal based on controls in the smart module 50, as explained herein.

An end of each of the black input wire 106, the white neutral wire 108 and the red output wire 110 can each be connected/coupled to a connector 112. Each connector 112 can be, for example, a compact splicing connector or other type of electrical connector. Each connector 112 can bring a corresponding wire into electrical conductivity/communication with another wire.

Additionally, the smart module 50 can also include a light sensor wire harness 114 extending from the face 104 of the smart module 50. The light sensor wire harness 114 can be formed of a flexible, electrically insulating material, such as rubber (e.g., synthetic rubber). Wires housed by the light sensor wire harness 114 may carry a direct current (DC) signal. Accordingly, in some examples, the light sensor wire harness 114 can include a noise suppressor 116 circumscribing the light sensor wire harness 114. The noise suppressor 116 could be implemented, for example as a ferrite bead/choke. Two wires can extend from the light sensor wire harness 114. In particular, an input wire 118 and an output wire 120 can each be electrically coupled to a light sensor 122.

The light sensor 122 can be implemented, for example, as a photodiode, a photocell, etc. In some examples, the light sensor 122 can be a normally open switch that closes upon detecting light below a threshold level. In other examples, the light sensor 122 can be a normally closed switch that opens upon detecting light below the threshold level. The light sensor 122 can include a locking nut 124 that can allow the light sensor 122 to be affixed in aperture 62 of the door 66, as explained herein.

The housing 100 of the smart module 50 can house electrical components for implementing a smart meter. For instance, in some examples, the smart module 50 can include a microcontroller within the housing 100. Additionally or alternatively, the smart module 50 can include an application specific integrated circuit (ASIC) within the housing 100. In particular, the electrical components housed by the smart meter 50 can measure voltage, current and power and/or other electrical signals that traverse the smart module 50. Additionally, the smart module 50 can include a wireless network interface card (NIC) in the housing 100 that communicate with nodes and other components on a mesh network. In some examples, the NIC can be connected to an internal antenna to communicate with the nodes on the mesh network. In other examples, the NIC can be coupled to an external antenna via a radio frequency (RF) port 111 to communicate with the nodes on the mesh network.

As used herein, throughout this disclosure, the term "smart meter" refers to a metering device that implements/employs smart metering technology. One of ordinary skill will understand and appreciate the various types of devices and technologies that could be employed to implement such smart metering technology.

As noted, the smart module 50 can be installed (retrofitted) in the lighting fixture 52. To install the smart module 50, an installer (e.g., an electrical technician) can disconnect and remove the photocell receptacle 72 from the door 66. In particular, to disconnect the installer can clip/cut the black input wire 82, the white neutral wire 84 and the red output wire 86 coupled to the photocell receptacle 72. Additionally, to install the smart module 50, the photocell tray 70 can be removed by removing a fastener 71 that holds the photocell tray 70 to the door 66.

Still further, the first and second hold-down brackets 76 and 78 can be removed by removal of the fasteners 80. Removal of the first and second hold-down brackets 76 and 78 allows for removal of the window 74, such that the aperture 62 is exposed to open air.

The housing 100 of the smart module 50 can be sized to allow insertion of the housing 100 via the opening 67 into the internal cavity 68 of the base portion 55. For example, the housing 100 could have a first dimension (labeled in FIG. 1C as "D1") of about 6 centimeters (cm), a second dimension (labeled in FIG. 1C as "D2") of about 10.6 cm and a third dimension (labeled in FIG. 1C as "D3") of about 9.6 cm. Thus, in the example illustrated, each of the first, second and third dimensions is less than about 12 cm. In other examples, other lengths for the dimensions can be employed.

Upon inserting the smart module 50 into the internal cavity 68, the installer can connect the black input wire 106 of the power wire harness 102 to the black input wire 82 of the base portion 55 by inserting the black input wire 82 of the base portion into the connector 112 attached to the black input wire 106 of the power wire harness 102 and crimping the black input wire 82 of the base portion 55. In a similar fashion, the installer can connect the white neutral wire 84 of the base portion 55 with the white neutral wire 108 extending from the power wire harness 102. Also in similar fashion, the installer can connect the red output wire 86 to the red output wire 110 extending from the power wire harness 102.

Figure 2:
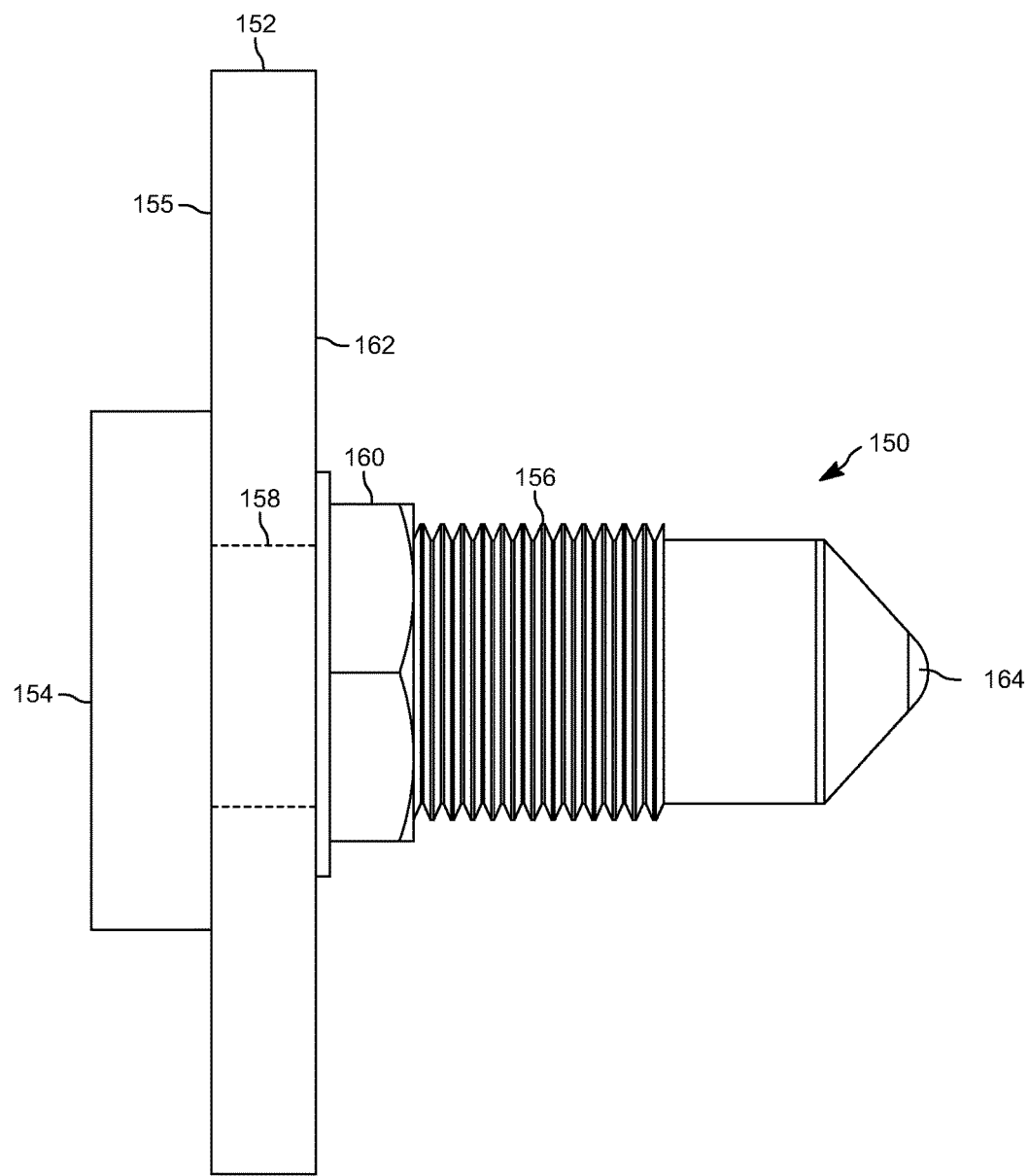
FIG. 2 illustrates a diagram of a light sensor affixed to a door of a base portion of a lighting fixture.

Additionally, the installer can install the light sensor 122 into the aperture 62 of the door 66. FIG. 2 illustrates a detailed view of a light sensor 150 (e.g., the light sensor 122) installed into a door 152 (e.g., the door 66). As illustrated in FIG. 2, the light sensor 150 includes a base portion 154 that abuts an interior side 155 of the door 152, which interior side 155 can face an internal cavity (e.g., the internal cavity 68 of FIG. 1C) of a base portion (e.g., the base portion 55 of FIG. 1C) of a lighting fixture (e.g., the lighting fixture 52 of FIGS. 1A-1C). Moreover, the light sensor 150 includes a threaded portion 156 that extends through an aperture 158 (e.g., the aperture 62 of FIG. 1C) in the door 152. The aperture 158 is hidden from view, and is accordingly represented with dashed lines. The threaded portion 156 can have an elongated cylindrical shape.

A locking nut 160 can be mated with the threaded portion 156 and tightened to affix the light sensor 150 to an exterior side 162 of the door 152. In this manner, a light detecting portion 164 at an end of the light sensor 150 is exposed to an ambient light present at an exterior of a lighting fixture.

The light detecting portion 164 can represent a photosensitive region (e.g., a solar cell) of the light sensor 150.

Referring back to FIG. 1C, upon installing the light sensor 122 in the aperture 62, the door 66 can be reattached to the base portion 55. The smart module 50 can be installed in the lighting fixture 52 by the installer rather quickly, such as in about 15 minutes or less.

Figure 1D:
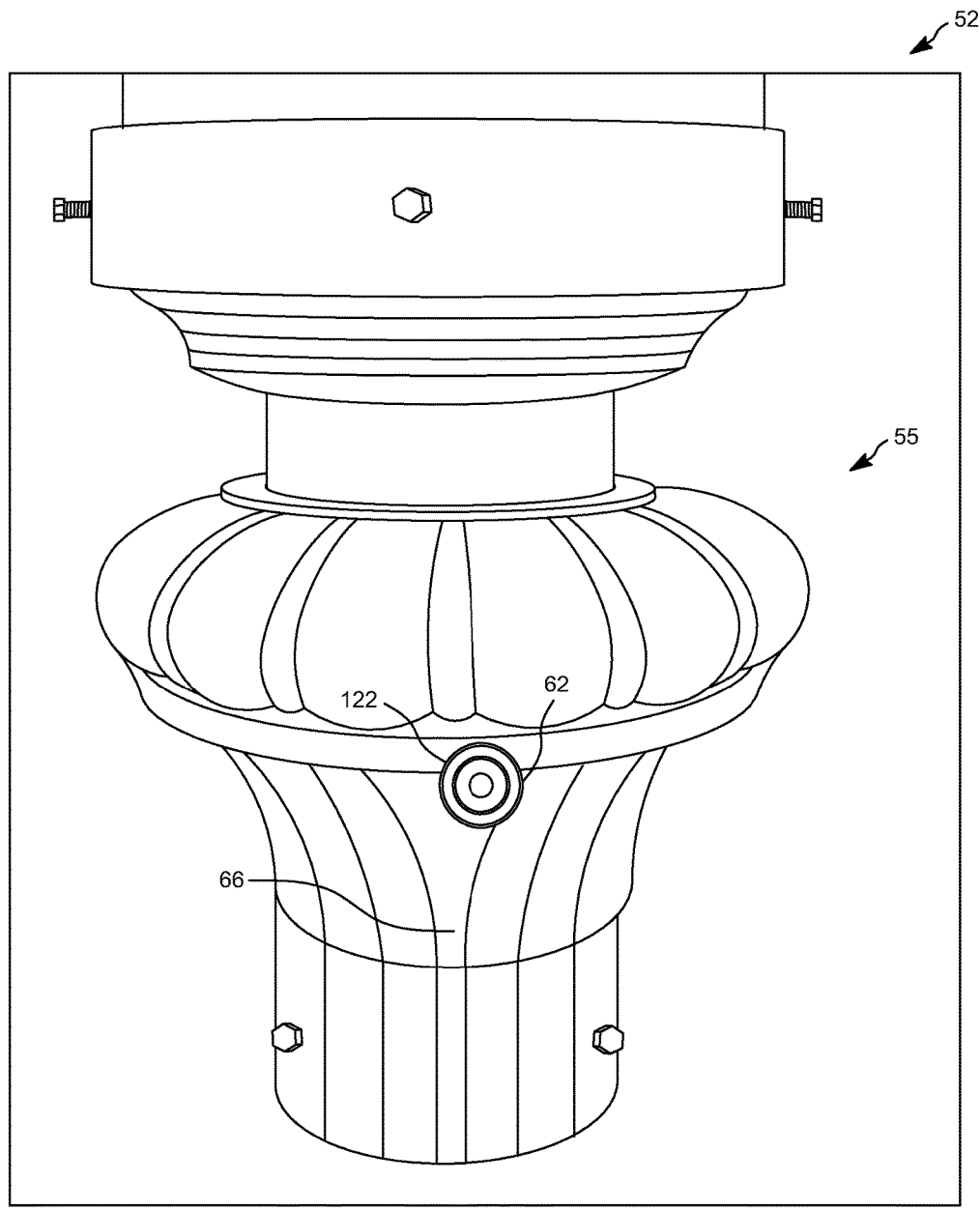
FIG. 1D illustrates an expanded view of the base portion of the lighting fixture upon completing installation of the smart module.

FIG. 1D illustrates an example of the base portion 55 wherein the smart module 50 is installed and the door 66 is reattached to the base portion 55 of the lighting fixture 52. As is illustrated in FIG. 1D, upon installation of the smart module 50 and reattachment of the door 66, the light sensor 122 is exposed to ambient light from the external environment vis the aperture 62.

Moreover, referring back to FIG. 1A, upon installation of the smart module 50 into the lighting fixture 52, smart meter operations for the lighting fixture 52 can commence. For example, in a manner similar to the operation of a standard photocell, the smart module 50 can (via the light sensor 122) detect the ambient light level of the environment. Upon detecting that the ambient light of the environment has dropped below a predetermined threshold level, the smart module 50 can energize (e.g., with a 120 V AC signal) the red output wire 110 that is coupled to the ballast (or driver) of the lighting fixture 52, causing the light source inserted into the light source receptacle of the lighting fixture 52 to illuminate (turn on). Moreover, upon detecting that the light of the environment has returned to a level above the predetermined threshold, the smart module 50 can deactivate the red output wire 110, thereby causing the light source to deactivate (turn off).

Furthermore, as noted, the smart module 50 can communicate with the nodes and other components on the mesh network via a NIC installed therein. Moreover, as noted, the smart module 50 can measure voltage and current traversing the smart meter and measure an amount of power (e.g., kilowatt hours (kWh)) consumed at the lighting fixture 52. Accordingly, in response to a request from an authorized node of the mesh network, the smart module 50 can send packets via the mesh network characterizing measured voltage, current and/or power consumed by the lighting fixture 52. Additionally, in some examples, the authorized node can control operation of the lighting fixture 52, for example, in situations where the lighting fixture 52 needs maintenance or a payment for past power consumed at the lighting fixture 52 is delinquent, the authorized node may instruct the smart module 50 to deactivate (e.g., turn off) a signal at the red output wire 110 independent of the presence or absence of ambient light.

Thus, by installing the smart module 50 into the lighting fixture 52, smart meter operations can be implemented in situations where a top portion 60 of the lighting fixture 52 has no electrical connection. Moreover, the smart module 50 can be sized and configured such that no manufacturing modifications to the lighting fixture 52 are needed.

Figure 3:
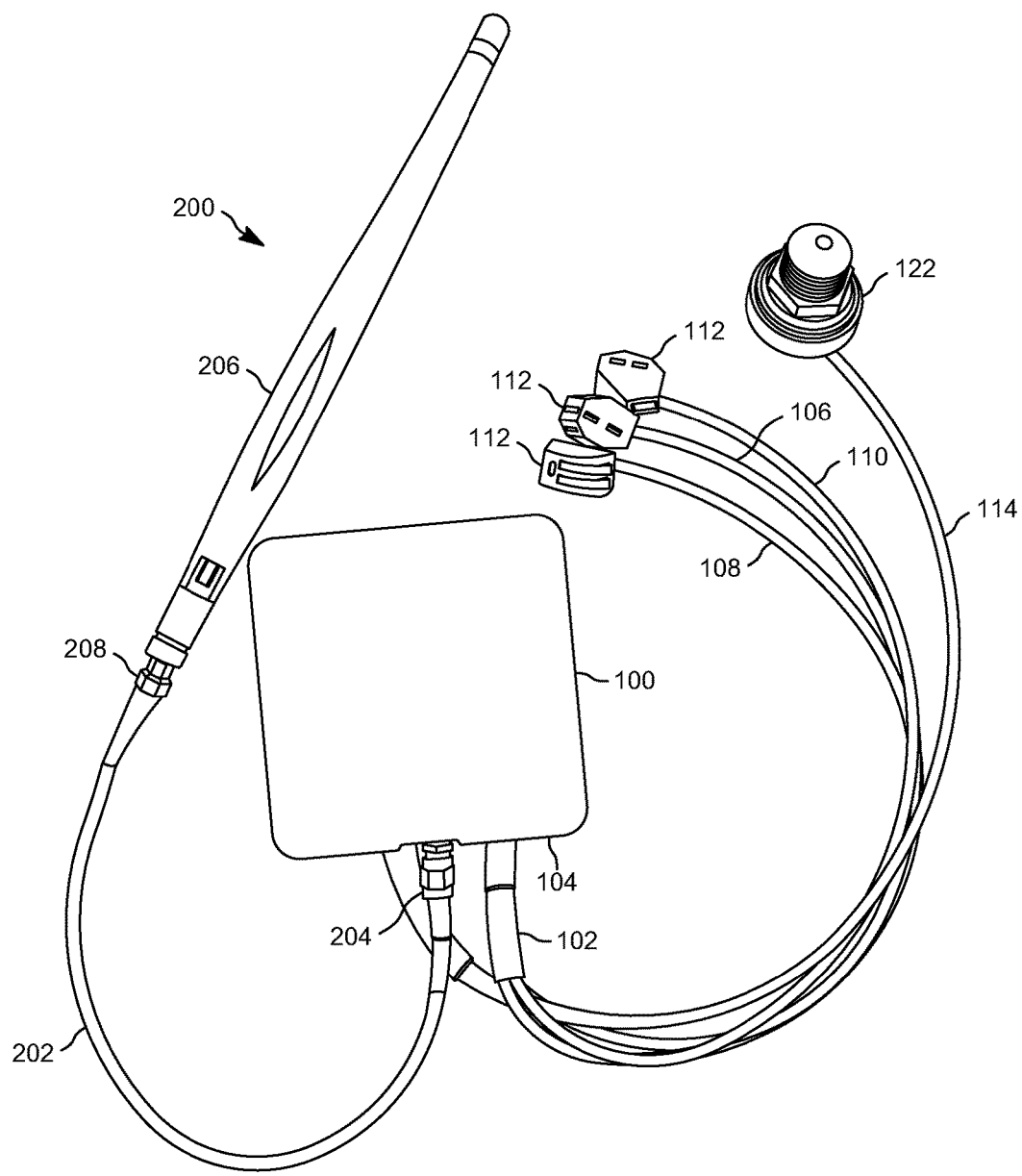
FIG. 3 illustrates an example of a smart module with an external antenna.

FIG. 3 illustrates another example of a smart module 200 that can be installed in a lighting fixture. For purposes of simplification of explanation, the same reference numbers are employed in FIGS. 1A-1D and 3 to denote the same structure. Thus, for simplification of explanation, the features that are common to the smart module 200 and the smart module 50 are not re-introduced. The smart module 200 includes a coaxial cable 202 that is coupled to the housing 100 via a given RF connector 204 on the face 104 of the housing 100. The coaxial cable 202 can also be coupled to an antenna 206 via another RF connector 208.

Moreover, it is noted that in some examples, compared to the smart module 50 of FIGS. 1A and 1C, an internal antenna in the housing 100 may be omitted. Alternatively, in some examples, connection of the antenna 206 to the housing 100 may cause the internal antenna to be deactivated. Relative to the internal antenna of the smart module 50 illustrated in FIGS. 1A and 1C, the antenna 206 (an external antenna) has an increased gain.

To install the smart module 200 into a lighting fixture, such as the lighting fixture 52 illustrated in FIGS. 1A-1D, an installer can follow substantially the same procedure as the installation of the smart module 50 described with respect to FIG. 1C. However, in addition to the actions described, prior to reattaching the door 66, the antenna 206 can be inserted into the internal cavity 68 (e.g., pointing away from the top portion 60 illustrated in FIG. 1A).

The smart module 200, with the (external) antenna 206 attached may be installed in a lighting fixture where difficulty in reading signals (voltage, current and power consumed) output by another smart module (e.g., the smart module 50) was experienced or is anticipated. This difficulty may be caused, for example, by electromagnetic interference (EMI) in proximity to the lighting fixture.

Figure 4:
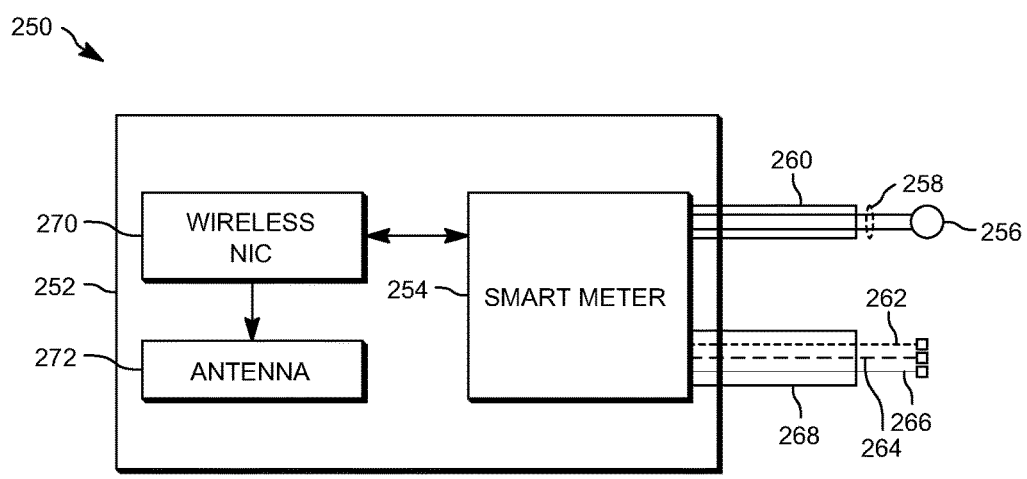
FIG. 4 illustrates an example of a block diagram of a smart module for installation in a lighting fixture.
Figure 4:
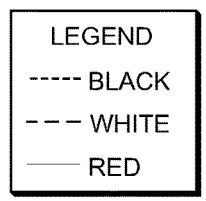

FIG. 4 illustrates a diagram of an example of a smart module 250. The smart module 250 can be employed, for example, to implement the smart module 50 of FIGS. 1A-1D and/or the smart module 200 of FIG. 3. The smart module 250 includes a housing 252 that is sized to fit through an opening covered by a door in a lighting fixture, such as the door 66 of the lighting fixture 52 illustrated in FIGS. 1A-1D. The housing 252 could have, for example a first dimension of about 6 cm, a second dimension of about 10.6 cm and a third dimension of about 8.6 cm.

A smart meter 254 can be positioned within the housing 252. The smart meter 254 can be coupled to a light sensor 256 via a set of wires 258. The set of wires 258 can be protected by a light sensor wire harness 260, which can be implemented as a flexible tube formed of electrically insulating material. The light sensor 256 can be implemented, for example, as a switch (e.g., a photodetector) that changes state (opens or closes) in response to being exposed to light that is above or below a predetermined threshold.

Additionally, the smart meter 254 can be coupled to power wires. In particular, the smart meter 254 can be coupled to a black input wire 262, a white neutral wire 264 and a red output wire 266. The power wires can be protected by a power wire harness 268, which can also be implemented as a flexible tube formed of an electrically insulating material.

The black input wire 262 can be coupled to an AC input signal of 105 to 305 V AC. The white neutral wire 264 can be coupled to an electrically neutral node (e.g., at about 0 V). The red output wire 266 can be coupled to a ballast (or driver) of a lighting fixture.

The smart meter 254 can be implemented as a controller, such as a microcontroller, an ASIC or a general purpose computer processor that accesses a non-transitory machine readable memory, etc. The smart meter 254 can include circuitry components for metering electricity. In particular, the smart meter 254 can measure and record (in a non-transitory memory) a voltage or current input by the black input wire 262. Similarly, the smart meter 254 can measure and record voltage or current output to the red output wire, as well as measure and record (in the non-transitory memory), power output to the red output wire 266, which corresponds to a power consumed, which may be measured in kWh.

The smart meter 254 can be coupled to a wireless NIC 270 included in the housing 252. The wireless NIC 270 can be configured to communicate on a wireless Internet Protocol Version 6 (IPv6) network. In some examples, this wireless network could be referred to as a mesh network. The wireless NIC 270 can transmit and receive network packets via an internal antenna 272 that is also included in the housing 252 in some examples. Alternatively, as illustrated with respect to FIG. 3, the antenna 272 could be external to the housing 252.

Upon installation in a lighting fixture, the smart meter 254 can control a signal output at the red output wire 266. In particular, the smart meter 254 can activate/energize (e.g., turn on) the red output wire 266 upon detecting that light detected by the light sensor 256 is below the predetermined threshold. In an activated/energized state, the red output wire 266 can provide a voltage of about 120 V AC to a ballast (or driver), as explained herein. Additionally, the smart meter 254 can deactivate/de-energize (e.g., turn off) the red output wire 266 upon detecting that the light detected by the light sensor 256 is above the predetermined threshold. In the deactivated/de-energized state the red output wire 266 can provide a voltage of about 0 V.

As explained herein, through a relatively simple procedure, the smart module 250 can be installed/retrofitted in a lighting fixture, wherein the lighting fixture lacks electrical connections to a top portion (e.g., globe). Upon installation in a lighting fixture, the wireless NIC 270 provides a data path between the smart meter 254 and a remote node on the IPv6 network. The smart meter 254 can be configured to monitor parameters of a retrofitted lighting fixture (e.g., status, power draw, light output, ambient light, etc.). Data characterizing the monitored parameters can be transmitted to the remote node via the wireless NIC 270. The smart meter 254 can further be configured to control an operation of the lighting fixture (in which the smart module 250 is installed) by energizing or de-energizing the red output wire 266 based on control parameters (e.g., light intensity, on/off times, etc.). The control parameters can be updated in response to control updates from the remote node. Alternatively, the control parameters can be updated based on the monitored parameters (e.g., signals generated by the light sensor in response to ambient light).

Additionally, the smart meter 254 can operate in concert with the wireless NIC 270 to generate a response to a request for data (e.g., a ping) from a remote node on the IPv6 network (e.g., an authorized node). In particular, in response to a data request from the remote node, the smart module 250 can send the remote node data characterizing the metered voltages, currents and/or power consumed. Additionally, in some examples, the remote node can instruct the smart meter 254 to keep the red output wire 266 in the deactivated state, independent of the light detected by the light sensor 256.

Figure 5:
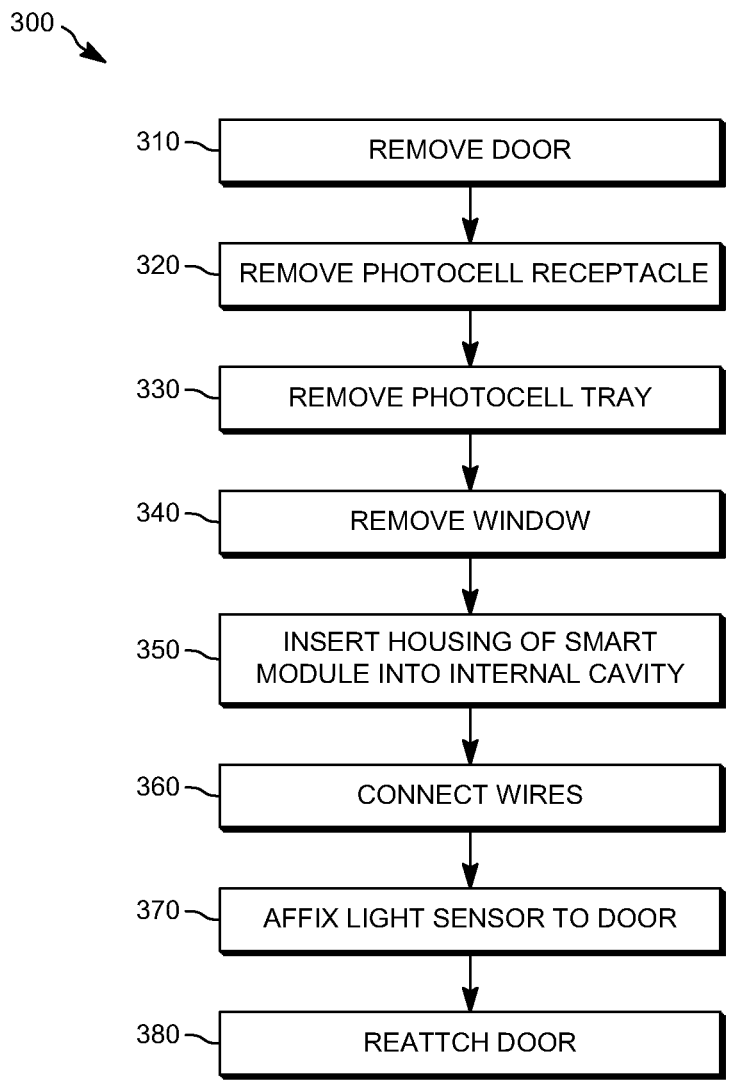
FIG. 5 illustrates a flowchart of an example method for installing a smart module into a lighting fixture.

In view of the foregoing structural and functional features described above, example methods will be better appreciated with reference to FIG. 5. While, for purposes of simplicity of explanation, the example method of FIG. 5 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 5 can be executed by an installer (e.g., an electrical technician).

FIG. 5 illustrates a flowchart of an example method 300 for installing (retrofitting) a smart module in a lighting fixture. The smart module could be implemented, for example, as the smart module 50 of FIGS. 1A-1D, the smart module 200 of FIG. 3 and/or the smart module 250 of FIG. 4. The lighting fixture could be implemented in a manner similar to the lighting fixture 52 of FIGS. 1A-1D. In particular, the lighting fixture lacks an electrical connection to a top portion, such as the top portion 60 of FIG. 1A.

At 310, a door (e.g., the door 66 of FIG. 1C) of the lighting fixture is removed/detached to expose an internal cavity (e.g., the internal cavity 68 of FIG. 1C) of the lighting fixture. At 320, a photocell receptacle (e.g., the photocell receptacle 72) can be removed from the lighting fixture. In some examples, to remove the photocell receptacle, fasteners (e.g., screws) may be loosened. Additionally, to remove the photocell receptacle, wires, such as a black input wire (e.g., the black input wire 82 of FIG. 1C), a white neutral wire (e.g., the white neutral wire 84 of FIG. 1C) and a red output wire (e.g., the red output wire 86 of FIG. 1C) may be cut, for example, with a wire cutter or other tool. At 330, a photocell tray (e.g., the photocell tray 70 of FIG. 1C) that holds the photocell receptacle can be removed from the door. To remove the photocell tray, fasteners (e.g., screws) can be removed from the door. At 340 a window (e.g., the window 74) covering an aperture (e.g., the aperture 62 of FIG. 1C) can be removed. To remove the window, hold-down brackets (e.g., the hold-down brackets 76 and 78 of FIG. 1C) can be removed.

At 350, a housing (e.g., the housing 100 of FIGS. 1A and 1C) of the smart module can be inserted into the internal cavity of the lighting fixture. At 360, wires in the internal cavity can be connected to power wires of the smart module. In particular, the black input wires, the white neutral wires and the red output wires can be connected together. At 370, a light sensor (e.g., the light sensor 122 of FIGS. 1A and 1C) of the smart module can be inserted through the aperture and affixed to the door, such as in a manner illustrated in FIG. 3. At 380, the door can be reattached to the lighting fixture.

What have been described above are examples. It is, of course, not possible to describe every conceivable combination of structures, components, or methods, but one of ordinary skill in the art will recognize that many further combinations and permutations are possible. Accordingly, the invention is intended to embrace all such alterations, modifications, and variations that fall within the scope of this application, including the appended claims. Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A smart module comprising:
   a housing sized for insertion through an opening of a lighting fixture that is exposed by removal of a door in a base portion of the light fixture, the base portion includes a receptacle for a transparent or translucent globe of the light fixture;
   a smart meter in the housing, the smart meter being electrically coupled to an input wire and an output wire; and
   a light sensor configured for affixing to the door of the base portion in a position that is exposed to light external to the housing, the light sensor being electrically coupled to the smart meter and the light sensor changing from a closed state to an open state based on detected light, the light sensor comprising:
a threaded portion extending from a base of the light sensor that receives a locking nut, wherein the locking nut and the base of the light sensor are sized for securing the light sensor in an aperture of the door.

2. The smart module of claim 1, wherein the lighting fixture lacks an electrical connection to a top portion of the globe.

3. The smart module of claim 1, further comprising a network interface card in the housing that communicates with a network.

4. The smart module of claim 3, wherein the network is an Internet Protocol Version 6 (IPv6) network.

5. The smart module of claim 3, wherein the smart meter provides a measured power output to the output wire to a node on the network in response to a request.

6. The smart module of claim 1, wherein the smart meter applies an alternating current (AC) signal to the output wire in response to receiving an indication from the light sensor that ambient light is below a predetermined threshold level.

7. The smart module of claim 1, wherein a shielding of the input wire and the output wire are each colored to match a color of a shielding of a corresponding wire in the lighting fixture.

8. The system of claim 7, wherein each of the input wire and the output wire are terminated at connectors that connect a respective wire to a wire in the lighting fixture.

9. The system of claim 1, wherein flexible tubing covers wires connecting the light sensor to the housing.

10. The smart module of claim 1, wherein each dimension of the housing is less than about 12 centimeters.

11. A method comprising:
detaching a door on a base of a lighting fixture, wherein the door includes an aperture;
removing a photocell receptacle affixed to the door;
inserting a housing of a smart module through an opening to an internal cavity of the base of the lighting fixture;
affixing a light sensor of the smart module to the door, wherein a light detecting portion of the light sensor is exposed to light via the aperture in the door; and
reattaching the door to the base of the fixture.

12. The method of claim 11, wherein the removing comprises cutting a plurality of wires coupled to the photocell receptacle.

13. The method of claim 12, further comprising:
connecting each of the plurality of wires cut to remove the photocell receptacle to corresponding power wires of the smart module.

14. The method of claim 11, further comprising:
removing a window overlaying the aperture in the door.

15. The method of claim 14, wherein the affixing comprises:
inserting a threaded portion of the light sensor through the aperture, wherein the light sensing portion of the light sensor protrudes out an exterior side of the door; and
attaching a locking nut to the threaded portion of the light sensor.

16. The method of claim 11, wherein the detaching further comprises detaching the door from the base lighting lacking an electrical connection to a globe of the fixture.

17. The method of claim 11, wherein the detaching further comprises detaching the door from the base lighting lacking an electrical connection to an acorn shaped globe of the fixture.

18. The method of claim 11, wherein the detaching further comprises detaching the door from the base lighting lacking an electrical connection to an acorn shaped globe of the fixture and the acorn shaped globe comprises a receptacle for a finial.

19. A method comprising:
detaching a door from a base of a lighting fixture that lacks an electrical connection to a top portion of a globe of the light fixture, wherein the door includes an aperture;
removing a photocell receptacle affixed to the door, wherein removing the photocell receptacle comprises:
cutting a plurality of wires coupled to the photocell receptacle;
removing a window that overlays the aperture;
inserting a housing of a smart module through an opening to an internal cavity of the base of the lighting fixture, wherein the smart module comprises a housing that houses a smart meter and a network interface card;
connecting each of a plurality of power wires of the smart module with a corresponding wire cut to remove the photocell receptacle;
affixing a light sensor of the smart module to the door, wherein a light detecting portion of the light sensor protrudes through the aperture in the door for exposure to an exterior side of the door; and
reattaching the door to the base of the fixture.

20. The method of claim 19, further comprising:
connecting an external antenna to the housing; and
inserting the external antenna into the internal cavity.

* * * * *